(12) United States Patent
Slupe et al.

(10) Patent No.: US 6,404,648 B1
(45) Date of Patent: Jun. 11, 2002

(54) ASSEMBLY AND METHOD FOR CONSTRUCTING A MULTI-DIE INTEGRATED CIRCUIT

(75) Inventors: James P. Slupe, Caldwell; Timothy V. Harper, Boise, both of ID (US)

(73) Assignee: Hewlett-Packard Co., Palo Alto, CA (US)

( * ) Notice: Subject to any disclaimer, the term of this patent is extended or adjusted under 35 U.S.C. 154(b) by 0 days.

(21) Appl. No.: 09/823,507

(22) Filed: Mar. 30, 2001

(51) Int. Cl.[7] ................................................ H05K 7/02
(52) U.S. Cl. .................. 361/760; 361/761; 257/723; 257/724; 257/778; 174/52.4; 438/107; 438/108
(58) Field of Search ........................ 34/760, 761, 764, 34/807, 812, 704, 707; 257/723, 724, 777, 778; 438/107, 108; 361/717, 718, 719

(56) References Cited

U.S. PATENT DOCUMENTS

| | | | | |
|---|---|---|---|---|
| 5,963,429 A | * | 10/1999 | Chen | 361/764 |
| 6,077,724 A | * | 6/2000 | Chen | 438/107 |
| 6,100,594 A | * | 8/2000 | Fukui et al. | 257/777 |
| 6,184,463 B1 | * | 2/2001 | Panchou et al. | 174/52.4 |
| 6,258,626 B1 | * | 7/2001 | Wang et al. | 438/107 |
| 6,294,838 B1 | * | 9/2001 | Peng | 257/777 |
| 6,294,839 B1 | * | 9/2001 | Mess et al. | 257/777 |

FOREIGN PATENT DOCUMENTS

| | | | | |
|---|---|---|---|---|
| JP | 360182731 A | * | 9/1985 | 257/777 |
| JP | 404028260 A | * | 1/1992 | 257/723 |

* cited by examiner

*Primary Examiner*—Boris Chervinsky

(57) ABSTRACT

A multi-die integrated circuit (IC) assembly and method for constructing the same are disclosed. Briefly described, the IC assembly can be constructed with a semiconductor die, a layer of die-attach material, and a flip-chip die. The semiconductor die may contain circuit elements disposed across a top surface of the die. The flip-chip die may be oriented such that circuit elements are disposed across a bottom surface of the flip-chip die. The die-attach material may contact and bond the non-circuit element surfaces of the semiconductor die an the flip-chip die (i.e., the bottom surface of the semiconductor die and the top surface of the flip-chip die). This configuration permits the close arrangements of input/output circuit drivers along the entire perimeter of each of the dies. A method for constructing the multi-die IC assembly is also presented. The method can be broadly summarized by the following steps: arranging a semiconductor die such that circuit components are found on the upper surface of the die; arranging a flip-chip such that circuit components are found on the lower surface of the flip-chip; and introducing a layer of die-attach material such that it contacts and bonds the lower surface of the semiconductor die and the upper surface of the flip-chip.

16 Claims, 9 Drawing Sheets

ASSEMBLY AND METHOD FOR CONSTRUCTING A MULTI-DIE INTEGRATED CIRCUIT

BACKGROUND OF THE INVENTION

1. Field of the Invention

The present disclosure relates to semiconductor devices and methods for constructing the same. More particularly, the invention relates to a multi-die integrated circuit (IC) assembly integrating multiple dies.

2. Discussion of the Related Art

Generally, the integrated circuit (IC) industry is continually attempting to improve the frequency of operation, performance, and integration density of integrated circuits (ICs) while simultaneously attempting to add new functionality and features to the same ICs. In order to improve performance while simultaneously increasing functionality, many different fabrication and packaging techniques are being utilized or proposed for use in the industry.

A number of different packaging technologies exist for attaching semiconductor devices to a printed circuit board (PCB). Three exemplary packaging technologies include ball-grid array (BGA), chip scale package (CSP), and direct chip attach (DCA). BGA is an older technology relative to CSP and DCA. A BGA consists of a plurality of solder balls spatially separated by a plurality of corresponding pads. The pads and their associated solder balls are distributed across an external surface of a BGA substrate such that when a suitably configured PCB comes in close contact with the plurality of solder balls, the solder balls contact the desired PCB interface conductors. The interface conductors located on the PCB are each configured with a similar pad spatially arranged to interface with a particular conductor on the BGA. In order to further interface with a semiconductor die such as a flip-chip die, a portion of the BGA may be configured with a plurality of contact pads suitably sized and arranged to interface with a plurality of solder bumps provided on a surface of the flip-chip. In this way, circuits contained on a flip-chip die may be interfaced with external circuits associated with the BGA. The various conductive elements of the BGA may further interface one or more circuits located on the flip-chip die with one or more circuits located on the PCB.

A CSP, on the other hand, is an interface assembly wherein a plurality of semiconductor dies interface conductors having associated pads for connecting a semiconductor die to a PCB are located on one surface of the semiconductor die. The remaining surfaces of the semiconductor die are typically encapsulated in a non-conducting material. The CSP interface architecture increases the utility of a given PCB surface area by decreasing the area required to attach the semiconductor die to the PCB. The last technology of the three exemplary construction technologies, DCA, involves the direct attachment of the semiconductor die to the PCB without a package. Flip-chips provided with solder bumps are representative of a DCA assembly.

As the demand for high speed, high performance, low cost, and portable semiconductor based electronic devices grows the integration density and complexity of semiconductor-packaging technologies continually adapts. One approach for achieving a greater integration density is to construct semiconductor device packages having multiple semiconductor dies. These packages are often referred to as multi-chip modules. Multi-chip modules (MCMs) may contain microprocessor circuits along with a host of peripheral circuits, such as memory management units, input/output controllers, peripheral component interconnect controllers, application specific integrated circuits and other such devices.

The most common MCM is a "side-by-side" MCM. In a "side-by-side" configuration, two or more dies are mounted next to each other on a mounting surface that may take the form of a plastic molded cavity, a cavity package, or a chip on board (COB) assembly. The die may be mounted directly to a principle-mounting surface or the die may be mounted on a substrate, which may be further mounted to a principle-mounting surface (e.g., a BGA or a PCB). Electrically conductive connections among the die and the various electrical leads are commonly made via wire bonding to a plurality of conductive pads associated with the dies.

An exemplary MCM configuration is illustrated in FIG. 1. The multi-chip arrangement in the perspective schematic of FIG. 1 is representative of the general configuration selected for the Pentium Pro™ product from Intel Corporation (Santa Clara, Calif.). As illustrated in FIG. 1, the MCM 10 comprises a first semiconductor device 12a and a second semiconductor device 12b. As shown in FIG. 1, the first and second semiconductors 12a and 12b may be arranged laterally adjacent to one another in the MCM 10. The first semiconductor 12a and the second semiconductor 12b may both be configured with a plurality of bond pads 14 along one or more edges of the respective semiconductor devices 12a, 12b. These bond pads 14 may be used to electrically couple select conductors located on the respective semiconductor dies 12a, 12b to circuitry on one or more integrated circuits or other devices external to the MCM 10.

One problem associated with placing multiple semiconductor dies within a single package is related to the distribution of the various signals, which traverse the various semiconductor dies. Many semiconductor dies can be the size of a postage stamp. At this scale, internal routing lengths on a single IC configured on either semiconductor device 12a, 12b may be significant and performance limiting. Once internal IC routing lengths are traversed across the surface of the IC, a bond pad 14 is needed to enable the circuit elements on the IC to interface with external circuits. As a result, the bond pads 14 and necessary wire length needed to traverse the gap from the first semiconductor device 12a to the second semiconductor device 12b further increase the routing length of interface signals. These relatively lengthy interface connections have increased resistance, inductance, and capacitance than most other conventional IC connections. Due to the change in the electrical characteristics (i.e., the characteristic impedance) between internal IC interconnections and the lengthy interface connections, many high-performance IC products (e.g., products having a desired operation at or above a few megahertz) may not meet timing specifications and may be frequency limited.

While the MCM module 10 illustrated in FIG. 1 allows more integrated circuits to be packaged in a single semiconductor package, the MCM 10 still suffers from parasitic impedance and routing problems as previously described. Another disadvantage results from the fact that the overall MCM 10 contains a larger footprint thus requiring a larger surface area on a PCB configured to interface with the MCM 10. As illustrated in the schematic diagram of FIG. 1, the first semiconductor 12a may be electrically interconnected with the second semiconductor 12b via one or more line bonds 20 that traverse the gap between adjacent lateral edges of the semiconductors 12a and 12b. In order to control input and output (I/O) interface-conductor impedance characteristics and to limit the physical size of circuit elements required to transmit various signals across dies, prior art "side-by-side"

MCM approaches have generally resorted to placing high-speed interface drivers along adjacent edges of the sending and receiving semiconductor dies. The concentration of I/O drivers along adjacent edges of the various multiple dies in a "side-by-side" MCM limits the number of impedance controlled interfaces between the various dies. In addition, the concentration of high-speed interface signals in increasingly close quarters, increases the probability of encountering radio-frequency interference between interface conductors.

A second problem that adversely affects the manufacture of semiconductor ICs in general is that absent new manufacturing technology, requirements to increase the functionality available in various IC devices force IC designers to use larger and larger die areas. With larger die areas comes an associated risk of encountering a manufacturing defect and the need for larger and larger semiconductor devices to drive the IC to IC interface signals. As a result, MCMs may provide increased functionality but yields may decrease and impedance controlled I/O interfaces are limited.

SUMMARY OF THE INVENTION

The present invention relates to a multi-die integrated circuit (IC) assembly integrating multiple semiconductor dies. Briefly described, the IC assembly can be constructed with a first semiconductor die, a layer of die-attach material, and a flip-chip die. The first semiconductor die may comprise a standard semiconductor die with active circuit elements disposed across the top surface of the die. The flip-chip die may be oriented such that active circuit elements are disposed across the bottom surface of the flip-chip die.

The back-to-back or non-circuit to non-circuit surface orientation of the multi-die IC assembly results in an increase in the length of adjacent edges between the first semiconductor die and the flip-chip die. In addition, the distance between the I/O interface drivers and the length of any necessary interface conductors may be minimized and tightly controlled. A further benefit of the multi-die IC assembly is that functionality may be separated across dies such that integration of the various circuits on the separated dies may in fact result in a decrease in the number of interface pads that require line bonding. By separating the functionality typically provided on a single semiconductor die into two smaller dies, the multi-die IC assembly yield may be improved over a single semiconductor wafer. In addition, the multi-die IC assembly manufacturing costs may be reduced over that of a larger die, as the wafer yield on a smaller die is generally higher than that for a larger die. Another benefit of using the multi-die IC assembly is that a smaller footprint on a PCB or BGA configured to receive the multi-die IC assembly may be used to interconnect the functionality provided by a larger die with its corresponding larger footprint requirement.

The present invention can also be viewed as providing a method for manufacturing a multi-die IC assembly. In this regard, the method can be broadly summarized by the following steps: arranging a first semiconductor die such that active circuit components are found on the upper surface of the die; arranging a flip-chip such that active circuit components are found on the lower surface of the flip-chip; and introducing a layer of die-attach material such that it contacts and bonds the lower surface of the first conductor and the upper surface of the flip-chip.

Other systems, methods, and features of the present invention will become apparent to one with skill in the art upon examination of the following drawings and detailed description. It is intended that all such additional systems, methods, and features included within this description, are within the scope of the present invention, and protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF A PREFERRED EMBODIMENT

Figure 1:
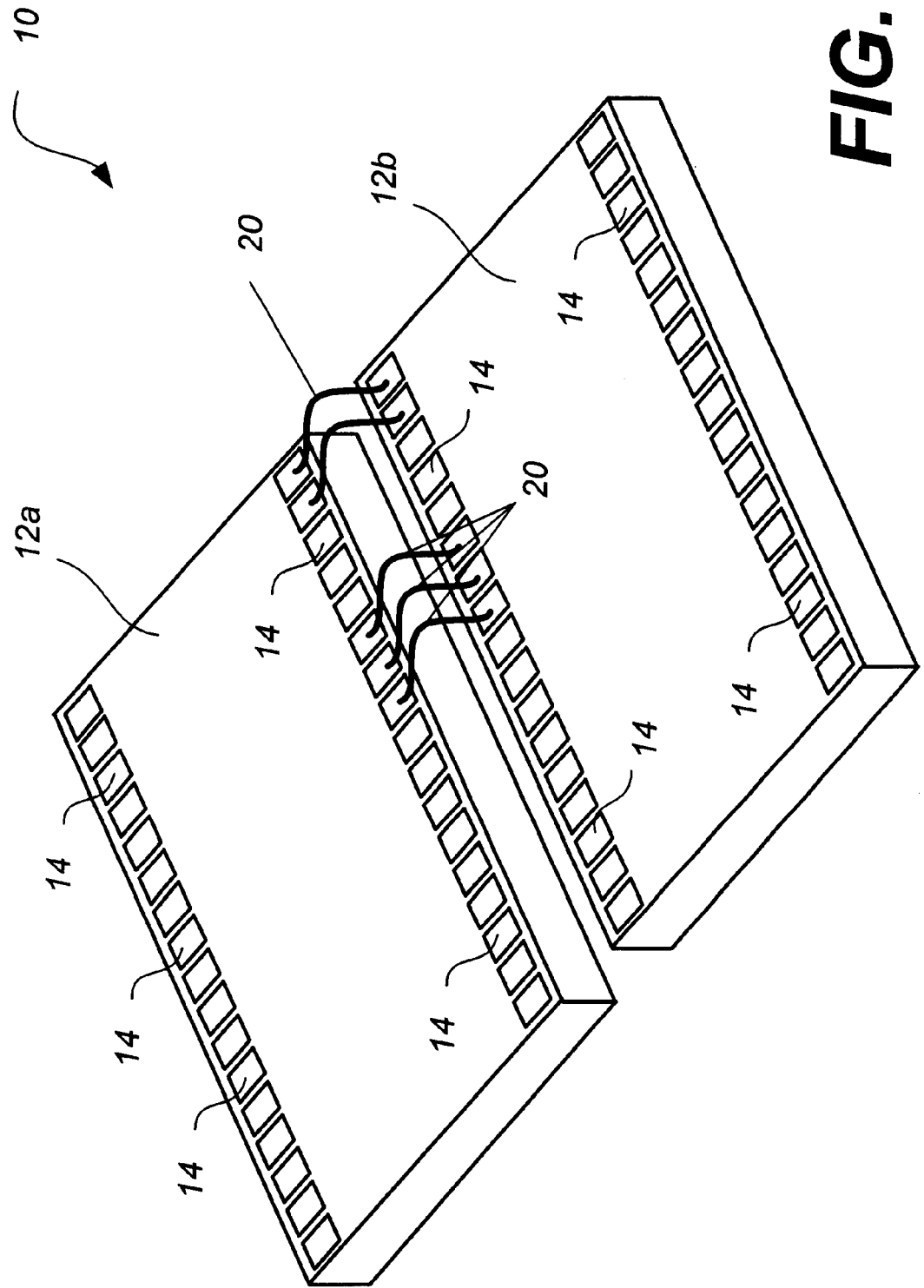
FIG. 1 is a perspective schematic illustrating a prior art approach to arranging multiple dies in a single package.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 2:
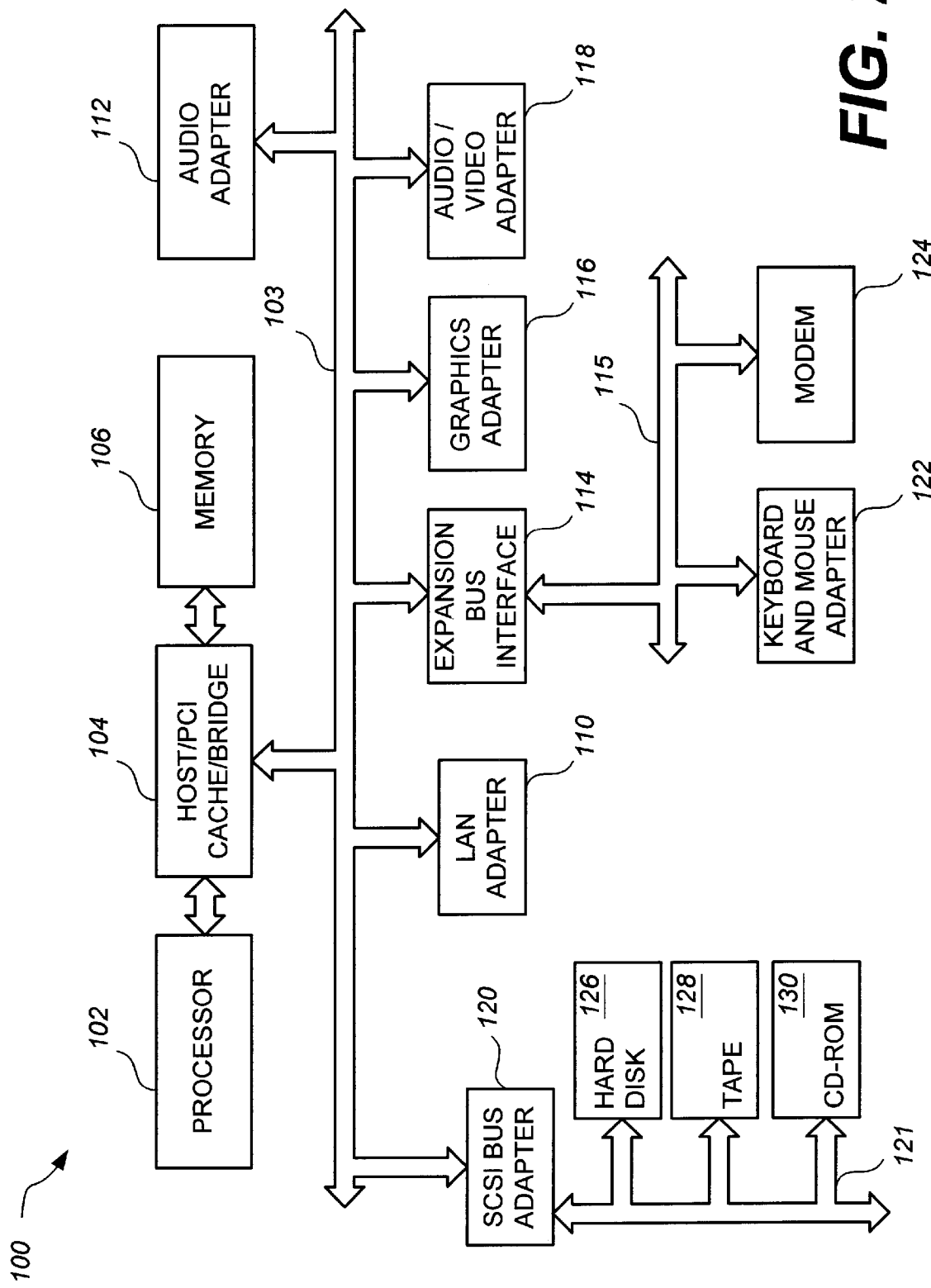
FIG. 2 is a schematic diagram illustrating a possible operational environment for a multi-die IC assembly.

Turning now to the drawings, wherein like reference numerals designate corresponding parts throughout the drawings, reference is made to FIG. 2, which illustrates a schematic of an exemplary operational environment suited for a multi-die IC assembly. In this regard, an exemplary operational environment may comprise a data processing system 100.

As illustrated in FIG. 2, a functional block diagram illustrates the data processing system 100 in which a multi-die integrated circuit assembly may be implemented. Multi-die integrated chip assemblies or packages containing a multi-die integrated circuit assembly may be implemented within the data processing system 100, which is an example of a typical computer system. The data processing system 100 employs a peripheral component interconnect (PCI) local bus architecture. Although the depicted example employs a PCI bus, other bus architectures such as microchannel and ISA may also be implemented. A processor 102 and a memory 106 are connected to the PCI local bus 103 through a PCI bridge 104. The PCI bridge 104 may include an integrated memory controller and cache memory for the processor 102. Additional connections to the PCI local bus 103 may be made through direct component interconnection or through add on printed circuit boards as is well known. In the illustrated example, a local area network (LAN) adapter 110, a small computer system interface (SCSI) bus adapter 120, and an expansion bus interface 114 may be connected to the PCI local bus 103 by direct component connections. In contrast, an audio adapter 112, a graphics adapter 116, and an audio/video adapter 118 may be connected to the PCI local bus 103 by add in boards inserted into expansion slots. The expansion bus interface 114 provides an electrical connection for a keyboard and mouse adapter 122, a modem 124 and may also apply a connection for additional memory devices (not shown) via an expansion bus 115. The SCSI bus adapter 120 provides a connection for a hard disk drive 126, a tape drive 128 and a compact disk read only memory (CD-ROM) drive 130. It will be appreciated that typical PCI local bus 103 implementations will support multiple PCI expansion slots or add in connectors to support a host of other peripheral devices (none shown).

A multi-die integrated circuit assembly may be implemented within the data processing system 100. In particular, a multi-die integrated circuit assembly may be located in an adapter, such as, for example but not limited to, the LAN adapter 110, and the SCSI bus adapter 120. A multi-die integrated circuit assembly may also be found within other adapters, such as the audio adapter 112, the graphics adapter 116, and/or the audio/video adapter 118. A multi-die integrated circuit assembly in accordance with the present invention may be assembled and interconnected with a ball-grid array (BGA) having an opening to expose the substrate to form a receiving cavity for the multi-die integrated circuit assembly. Of course, the multi-die integrated circuit assembly may be interconnected to external circuitry using other methods and devices other than a BGA. For example, the multi-die integrated circuit assembly may be connected directly to a PCB. Alternatively, the multi-die integrated circuit assembly may be encapsulated in a package having a plurality of interface conductors for further assembly with a socket or other such receptacle previously interfaced with a PCB, a BGA, or other such device. If a BGA is selected as an interface for a multi-die integrated circuit assembly it should be appreciated that the BGA may include a microprocessor or an application specific integrated circuit (ASIC), which may be able to access the multi-die integrated circuit assembly of the present invention. It will be appreciated that a bus within the BGA may be run such that other devices located externally to the multi-die integrated circuit assembly may access the various circuits within the multi-die integrated circuit assembly through the interfaces provided between the BGA and the multi-die integrated circuit assembly. For example, the processor 102 of the data processing system 100 or one of the various adapters may access memory or other circuitry located on the BGA.

Those of ordinary skill in the art will appreciate that the data processing system 100 illustrated in FIG. 2 may vary depending on the particular implementation. Other internal hardware or peripheral devices, such as a flash read only memory (ROM) or optical disk drives and the like may be used in addition to or in place of the hardware illustrated in the block diagram of FIG. 2. The multi-die integrated circuit assembly of the present invention may be used in a multi processor data processing system as well.

For example, the data processing system 100, if optionally configured as a network computer, may not include the SCSI bus adapter 120, the hard disk drive 126, and/or the CD-ROM device 130. By way of further example, the data processing system 100 may be a stand-alone system configured to be readable without relying on some type of network communication interface. As a further example, the data processing system 100 may be a personal digital assistant (PDA) device which is configured with rom and/or flash ROM in order to provide non-volatile memory for storing operating system files and/or user generated data. The example illustrated in FIG. 2 and described above is not meant to imply architectural limitations as to the type of data processing system in which the present invention may be used.

Figure 3:
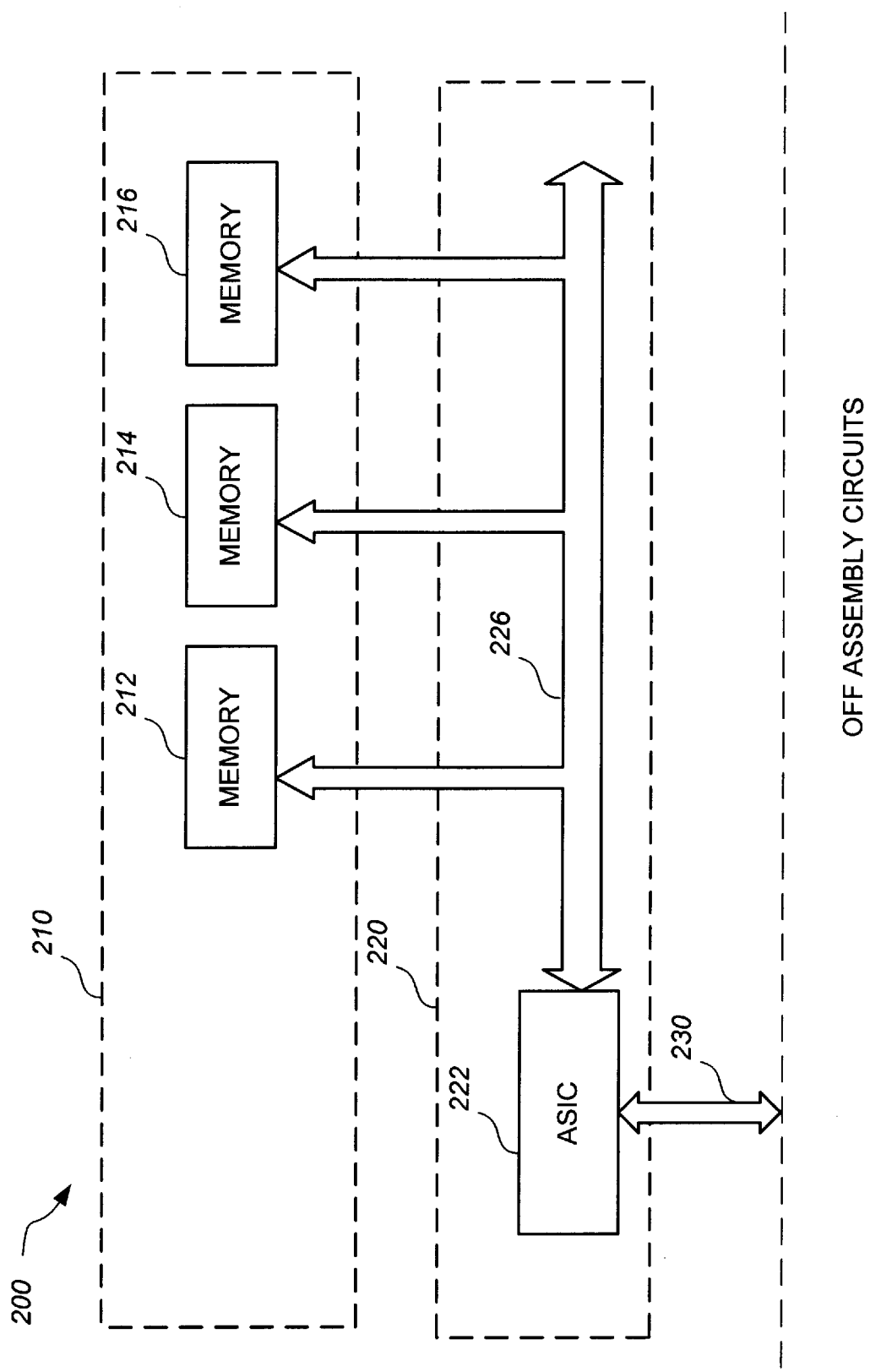
FIG. 3 is a functional block diagram of an exemplary embodiment of a multi-die IC assembly in accordance with the teachings and concepts of the present invention.

Reference is now directed to FIG. 3, which illustrates a functional block diagram of a multi-die integrated circuit assembly. A multi-die integrated circuit assembly 200 as shown in the exemplary illustration may comprise a first semiconductor die 210 and a second semiconductor die 220. As illustrated, the first semiconductor die 210 may comprise a plurality of separate memory devices 212, 214, and 216. The second semiconductor die 220 may contains an ASIC 222, as well as, appropriate conducting interfaces 226 to enable electrical coupling at the physical interface between the first and second semiconductor dies 210 and 220. As is further shown in this block diagram, the ASIC 222 may also include a separate input and output as well as power and ground connections via an interface 230 for connection to an off assembly PCB or printed circuit board or other suitably configured assembly.

The multi-die integrated circuit assembly 200 may take the physical form of a cavity down package, which contains a semi-conductor device, such as, the ASIC 222 as shown in this example. In such a configuration, the first semiconductor die 210 containing the plurality of memory devices 212, 214, and 216 may be configured such that it is incorporated with a substrate or other encapsulating material configured with a cavity for receiving the second semiconductor die 220. Once the first and second semiconductor dies 210, 220 have been electrically coupled to one another, the ASIC 222 may access the various memories 212, 214, and 216. It should be appreciated that chip scale packages (CSPs) containing circuitry other than the ASIC 222 may be interconnected with IC devices other than the memories 212, 214, and 216 in the manner illustrated in the functional block diagram of FIG. 3.

Figure 4:
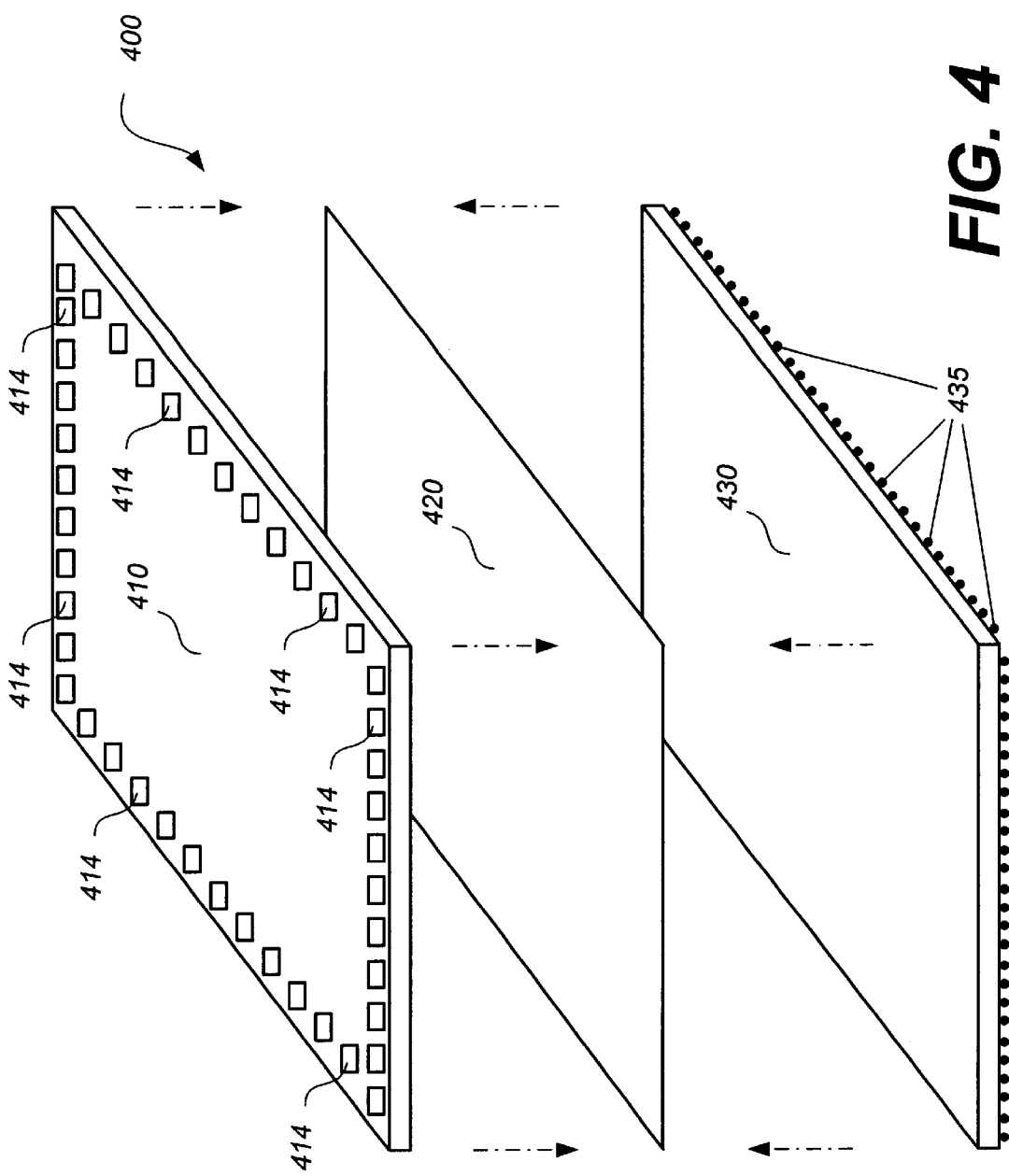
FIG. 4 is a perspective schematic illustrating the orientation of the various components of a multi-die IC assembly in accordance with the teachings and concepts of the present invention.

The data processing system of FIG. 2, as well as, an alternative possible environment for a multi-die integrated circuit assembly of the present invention in FIG. 3 having been described, reference is now directed to the multi-die integrated circuit assembly as shown in FIG. 4. As illustrated in the prospective view of FIG. 4, a multi-die integrated circuit assembly (MDICA) 400 may comprise an integrated circuit die 410, a layer of die-attached material 420, and a flip-chip die 430. As illustrated, the integrated circuit die 410 may be arranged such that a plurality of contact pads 414 are arranged generally along the external edges of one surface of the integrated circuit die 410. As is also illustrated in the perspective view of FIG. 4, the flip-chip die 430 may be arranged such that its components are found on the under side (i.e., the side where a plurality of solder bumps 435 are found).

As indicated by the multiple directional arrows shown in the perspective diagram of FIG. 4, the MDICA 400 may be constructed by closely arranging the first integrated circuit die 410 with the die-attached material 420 and further contacting the non-active circuit surface (i.e., the surface of the flip-chip die 430 devoid of circuit elements) of the flip-chip die 430. The back-to-back arrangement of the integrated circuit die 410, which may take the form of a standard integrated circuit die, and the flip-chip die 430 may be used to increase the density of integrated circuit logic, as well as, input and output drivers present within a given area.

A MDICA 400 may then be packaged by physically and electrically coupling the multiple solder bumps 435 located on the lower or circuit element surface of the flip-chip 430 with a BGA. Those signals designated to pass between the integrated circuit die 410 and the flip-chip die 430 located within the MDICA 400 can be routed via very well controlled impedance paths by line bonding designated bonding pads 414 located on the circuit surfaces of the integrated circuit die 410 and the flip-chip die 430. In addition, input and output drivers required to drive signals between the various ICs that may be found on the integrated circuit die 410 and the flip-chip die 430 can be kept to a minimum (i.e., the channel widths of the various semiconductor devices used to form the input and output drivers may be minimized) because of the relatively shorter distance that the line bonding material must traverse in order to couple the various circuits. Minimizing the channel widths of the various semiconductor devices used in the output drivers can result in a significant power reduction, which can reduce heat generation within the MDICA 400.

Another advantage of this multiple layer design results from the decrease in the required surface area to produce the same functionality of much larger MCM configurations. The required surface area to host an equivalent amount of circuit functionality may be reduced for both a printed circuit assembly, as well as, on a BGA used to house the MDICA 400. It will be appreciated that cost savings will be much greater on the BGA substrate because it is more expensive to produce a BGA assembly having the same area as a PCB. It is significant to note that all four edges of both the integrated circuit die 410 and the flip-chip die 430 are available for short signal path connections as opposed to one side as in the traditional side-by-side planar approaches. In addition to those advantages previously discussed, a MDICA 400 consistent with the teachings of the present invention enables a single semiconductor device having a large footprint to be subdivided into two. This allows the functionality previously found on a single semiconductor device to be spread over two smaller semi-conductor dies. In this fashion, semiconductor yield may be improved and the associated manufacturing cost may be reduced.

Figure 5:
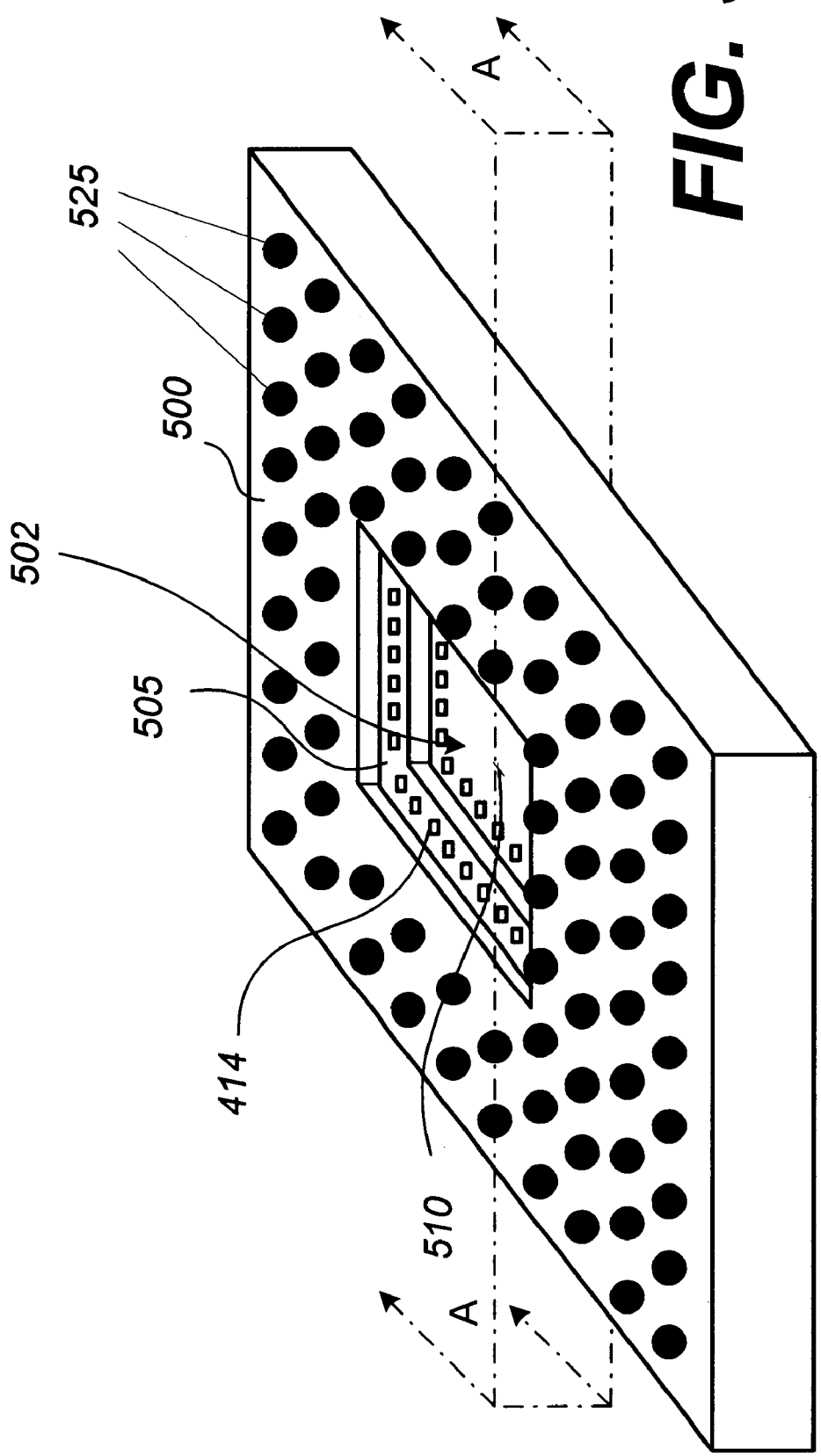
FIG. 5 is a perspective schematic of a ball grid array (BGA) configured to interface with the multi-die IC assembly of FIG. 4.

Reference is now directed to the various schematics of FIGS. 5 through 8, which illustrate a possible integration implementation for interconnecting the various circuitry located on the surfaces of the integrated circuit die 410 and the flip-chip die 430 of the MDICA 400 introduced in FIG. 4, with external circuitry as may be provided on a PCB, a BGA, or other such assemblies. Turning now to the perspective schematic shown in FIG. 5, a BGA 500 having a plurality of BGA solder balls 525 is introduced. As shown, the BGA 500 may be configured with an integration cavity 502 substantially centered within the upper layer of the BGA 500. The integration cavity 502 may be formed by a first integration layer 505 and a MDICA receiving layer 510. As shown in the illustration of FIG. 5, the MDICA receiving layer 510 may be further recessed from the upper surface of the BGA 500 (i.e., the surface containing the solder balls 525). As is also illustrated, a plurality of bond pads 414 may be provided along both the first integration level 505 and the MDICA receiving layer 510 for interconnecting the MDICA 400 with one or more external circuits integrated with the BGA 500.

It will be appreciated by those skilled in the art that the plurality of BGA solder balls 525 may be configured such that they are in physical and electrical contact with a distinct circuit interface. This physical and electrical contact may be formed on the upper surface of the BGA 500 using suitably configured contacts. Alternatively, the physical and electrical connection may be made with a solder column configured to traverse the various layers of the BGA 500. A solder column (not shown) may completely traverse the BGA substrate permitting electrical coupling between the upper surface of the BGA 500 with circuit elements on the lower (i.e., opposing) surface. Each of the BGA solder balls 525 may be arranged to substantially overlap a contact pad situated on the surface of a printed circuit assembly or a PCB. By turning the BGA 500 upside down, such that the integration cavity 502 is hidden from view, and applying the necessary heat to the plurality of BGA solder balls 525, the various integrated circuit devices integrated with the BGA 500 may be further integrated with external circuits to produce systems such as the data processing system 100 of FIG. 2.

Figure 6:
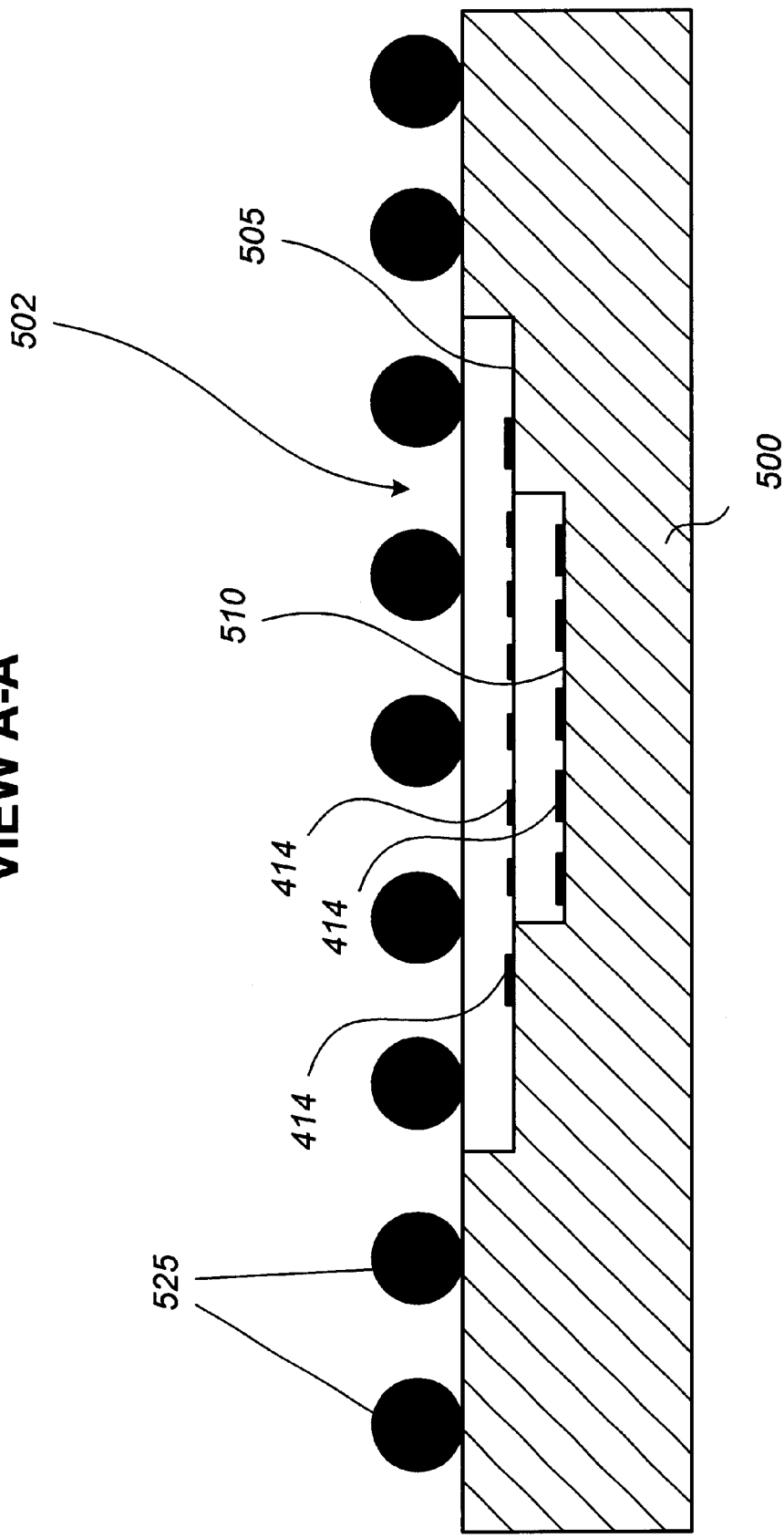
FIG. 6 is a cross-sectional view in the direction of line A—A of the BGA of FIG.5.

Reference is now directed to FIG. 6, which illustrates a cross-sectional view of the BGA 500 of FIG. 5 along line A—A as was shown in the perspective view of FIG. 5. The cross-sectional view of FIG. 6 further reveals detail associated with the integration cavity 502. As shown, the integration cavity 502 may comprise a two-tiered cavity formed by the combination of the first integration layer 505 as well as the MDICA receiving layer 510. As shown, each of the layers 505 and 510 may provide a plurality of bond pads 414 for integrating the MDICA 400 with one or more external circuits located within the BGA 500 or other assemblies integrated with the BGA 500. As illustrated in FIG. 6, the BGA 500 may provide a plurality of BGA solder balls 525 along the upper surface of the BGA 500 for forming an interconnection signal path with external circuits. It should be appreciated by those skilled in the art that the plurality of BGA solder balls 525 may be much larger in size than the bond pads 414 provided on each of the first integration layer 505 and the MDICA receiving layer 510. This relationship is necessitated by the much smaller solder ball size of the solder balls 435 associated with a flip-chip 430 in comparison with the BGA solder balls 525.

Figure 7:
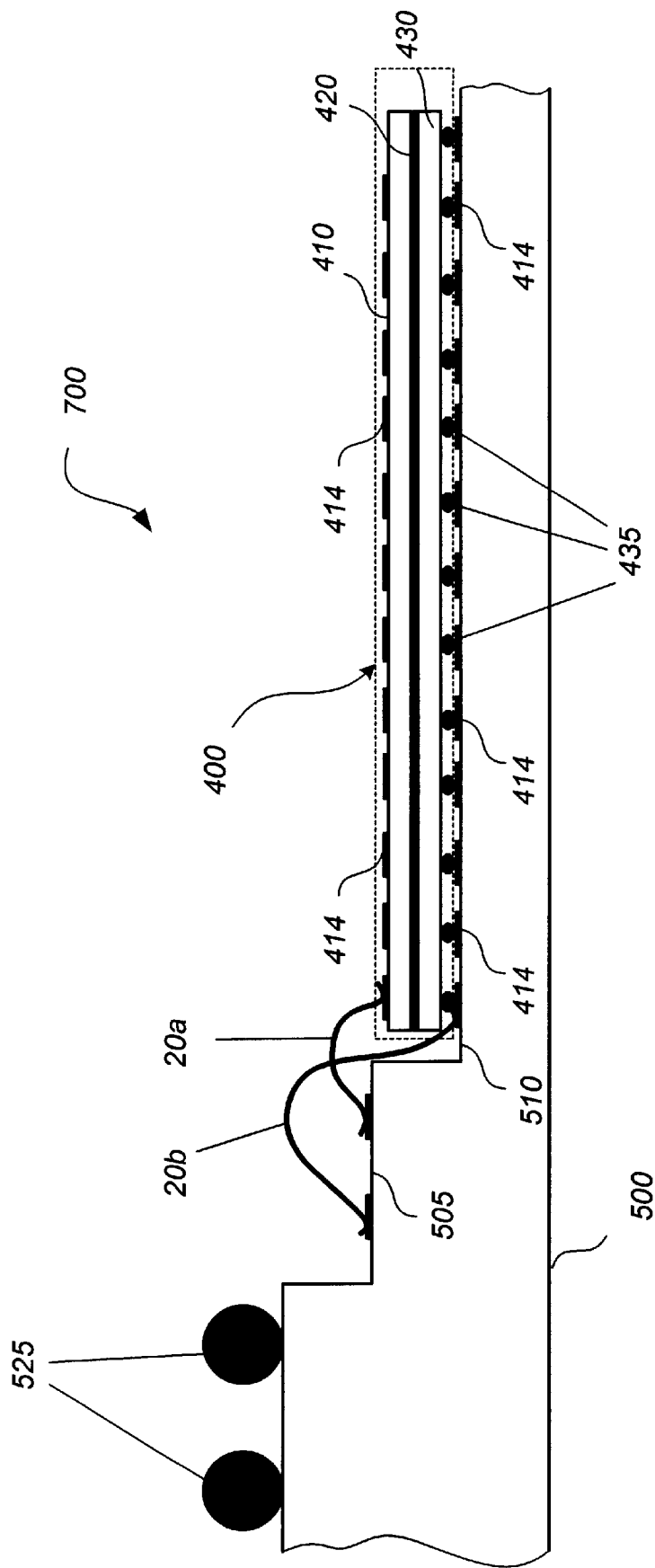
FIG. 7 is a schematic diagram of the multi-die IC assembly of FIG. 4 integrated with the BGA of FIG. 5.

The BGA 500 having been described with regards to FIGS. 5 and 6 reference is now directed to the side view of FIG. 7, which associates the MDICA 400 with the BGA 500. In this regard, the side view of FIG. 7 shows the BGA 500 integrated with the MDICA 400 of FIG. 4 to form a composite BGA assembly 700. As shown in FIG. 7, the plurality of flip-chip solder balls 435 may align with an associated contact pad 414 on the MDICA receiving layer 510 of the BGA 500. It will be appreciated that the flip-chip solder balls 435 provide both a physical and electrical interconnection between the MDICA 400 and the BGA 500. After interconnecting the MDICA 400 with the BGA 500, the plurality of bond pads 414 on the upper surface of the integrated circuit die 410 may be line bonded or wire bonded as is shown by an exemplary wire bond 20*a*. Preferably, the BGA 500 is configured to provide the necessary conductive structures to electrically route input/output signals originating from the flip-chip die 430 of the MDICA 400 to the various circuits present on the BGA 500. In an alternative implementation, it will be appreciated that one or more of the bond pads 414 located within the MDICA receiving layer 510 of the BGA may be wire bonded via wire bond 20*b*. In this manner, the plurality of wire bonds 20*a*, 20*b* permit the MDICA 400 to interface with external circuits located on or within the BGA 500. It will be appreciated that external circuits to the BGA 500 may be further interconnected with the various circuits provided by the MDICA 400 via one or more BGA solder balls 525 as further illustrated in the schematic of FIG. 7.

Figure 8:
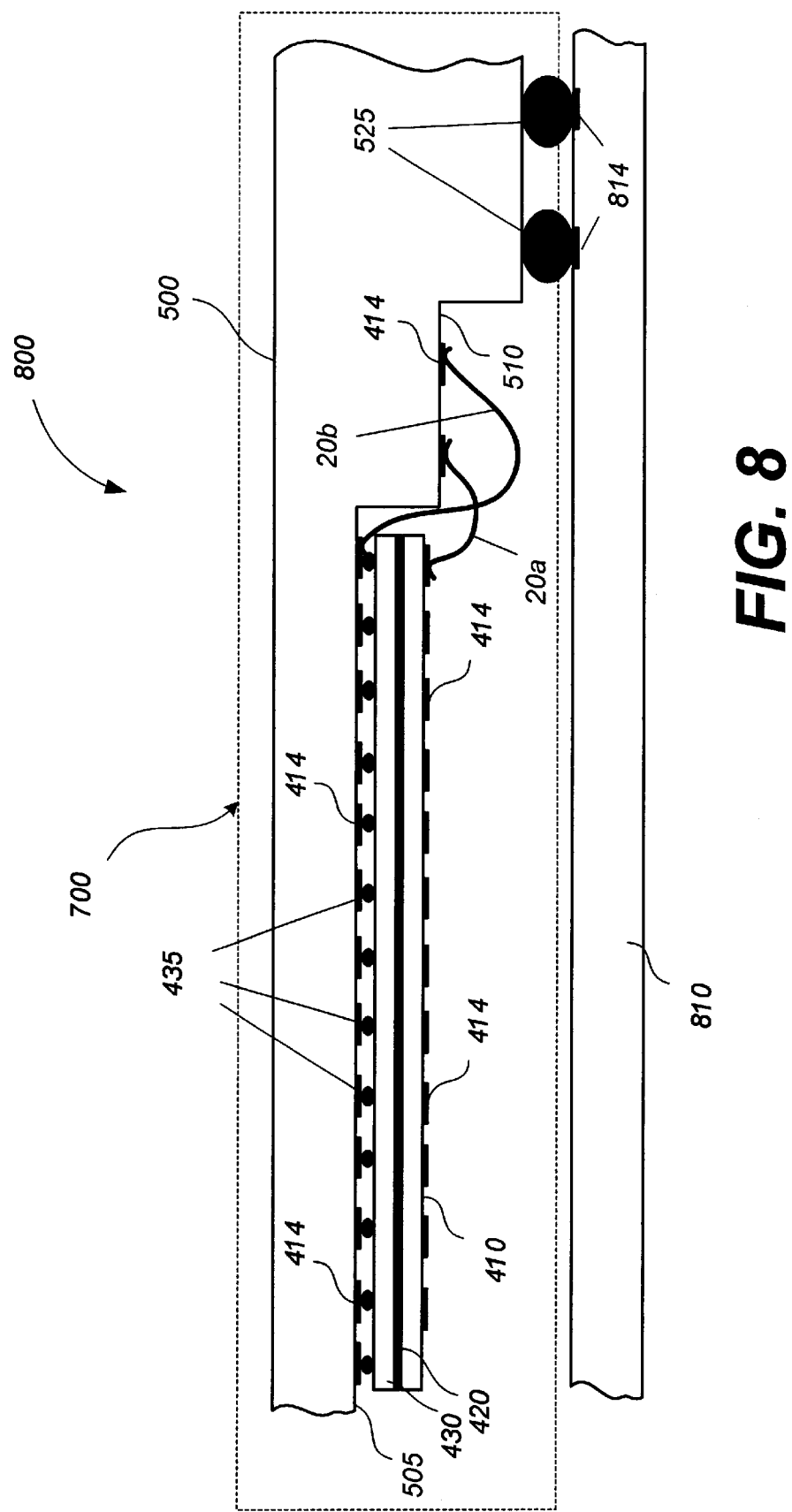
FIG. 8 is a schematic diagram of the integrated assembly of FIG. 7 in association with a printed circuit board (PCB).

Reference is now directed to the schematic of FIG. 8, which illustrates the integration of the composite BGA assembly 700 introduced in FIG. 7 with a printed circuit board 810. It will be appreciated by those skilled in the art that the arrangement illustrated in FIG. 8 is simply the BGA 500 of FIG. 7 as shown in its intended orientation (i.e., upside down) as in a cavity down configuration. As illustrated in FIG. 8, the composite BGA assembly 700 may be electrically and physically interfaced with the printed circuit board 810 via a plurality of contact pads 304 and a plurality of BGA solder balls 525. It will be appreciated that the plurality of contact pads 814 and the BGA solder balls 525 are spatially separated such that designated signals may traverse the interface between the composite BGA assembly 700 and the PCB 810 via respective conductive pathways formed by the combination of the contact pads 814 and each respective BGA solder ball 525.

The processes, steps, and structures described below do not form a complete process for manufacturing a MDICA 400. A MDICA 400 may be constructed in conjunction with integrated circuit fabrication package techniques currently used in the manufacturing art, and only so much of the commonly practiced process steps are included as necessary for an understanding of the present invention. With reference now to the flow chart of FIG. 9, a flow chart of a process for manufacturing a MDICA 400 of the present invention is presented. The process begins in step 905, herein labeled, "Start." Thereafter, in step 910, a first IC die is manufactured. After having constructed the first IC die in step 910, interface pads are applied to the die as indicated in step 915. Next, a flip-chip die is manufactured as indicated in step 920. As in the case of the first IC die, the flip-chip die, may be configured with interface pads as required to provide the necessary conductive pathways to integrate the first IC die with the flip-chip die as is shown in step 925. After having applied the interface pads in step 925, the method for manufacturing a MDICA 900 continues by applying the required solder bumps 435 on the interface pads of the flip-chip as illustrated in step 930. It should be appreciated that the separate and distinct processing steps for manufacturing and preparing the first IC die and the flip-chip die may be performed substantially simultaneously or in alternative methods in reverse order.

Next, as illustrated in step 935, the mating surfaces of the first IC die and the flip-chip die may be cleaned in preparation for bonding the dies with a die-attach material. Once the mating surfaces have been cleaned in step 935, the method for manufacturing a MDICA 900 continues with step 940 where a die-attach material is applied to the mating surfaces of the first IC die and the flip-chip die.

Once the dies have been attached to each other in step 940, the method continues by performing step 945 where the MDICA 400 (FIG. 4) is physically and electrically interconnected with a suitably configured mounting surface. It will be appreciated that a suitably configured BGA, PCB, or similar assembly may serve as the mounting surface for the MDICA 400. Next, in step 950, the process for manufacturing a MDICA 900 as shown in step 950 of the flow chart of FIG. 9, may introduce an "underfill" material (e.g., a non-conductive epoxy) to mechanically strengthen the physical bond between the MDICA 400 and the mounting substrate. The underfill material, once it has set-up or cured will provide structural support in addition to the plurality of flip-chip solder bumps 435 (FIG. 4) as the flip-chip solder bumps 435 alone cannot provide adequate mechanical support to permit the first semiconductor die 410 (FIG. 4) to be wire bonded by present wire bond techniques.

In addition to providing necessary structural support, the underfill material serves to protect the electrical integrity by preventing foreign electrically conducting objects from entering the volume formed by the lower surface of the flip-chip die 430 (FIG. 4) and the upper surface of the BGA 500 (FIG. 7). It will be appreciated that the underfill material will also protect the electrical and physical integrity of the plurality of solder bump interfaces between the MDICA 400 and the principle mounting surface as flip-chip solder bumps 435 (FIG. 4) because of their relatively small size and the relatively small size of the associated conductors (e.g., the bond pads 414) increases the stress per unit area due to thermal expansion and contraction, as well as, stresses caused by vibration between the MDICA 400 and the mounting surface.

After the underfill material has sufficiently cured to provide the necessary physical support to permit the wire bonding of the plurality of contact pads 414 present on the upper surface of the first IC die 410, the method for manufacturing a MDICA 900, may perform step 955 where as illustrated the dies of the MDICA 400 may be wire bonded as required to interconnect the various circuits on the multiple dies of the MDICA 400. It should be appreciated that the wire bonding of step 955 may comprise electrically interfacing various circuits between the individual dies of the MDICA 400 as well as, between the MDICA 400 with conductive elements on the mounting surface. As illustrated in the flowchart of FIG. 9, the method for manufacturing a MDICA 900 may be terminated in step 960, herein labeled, "Stop."

Figure 9:
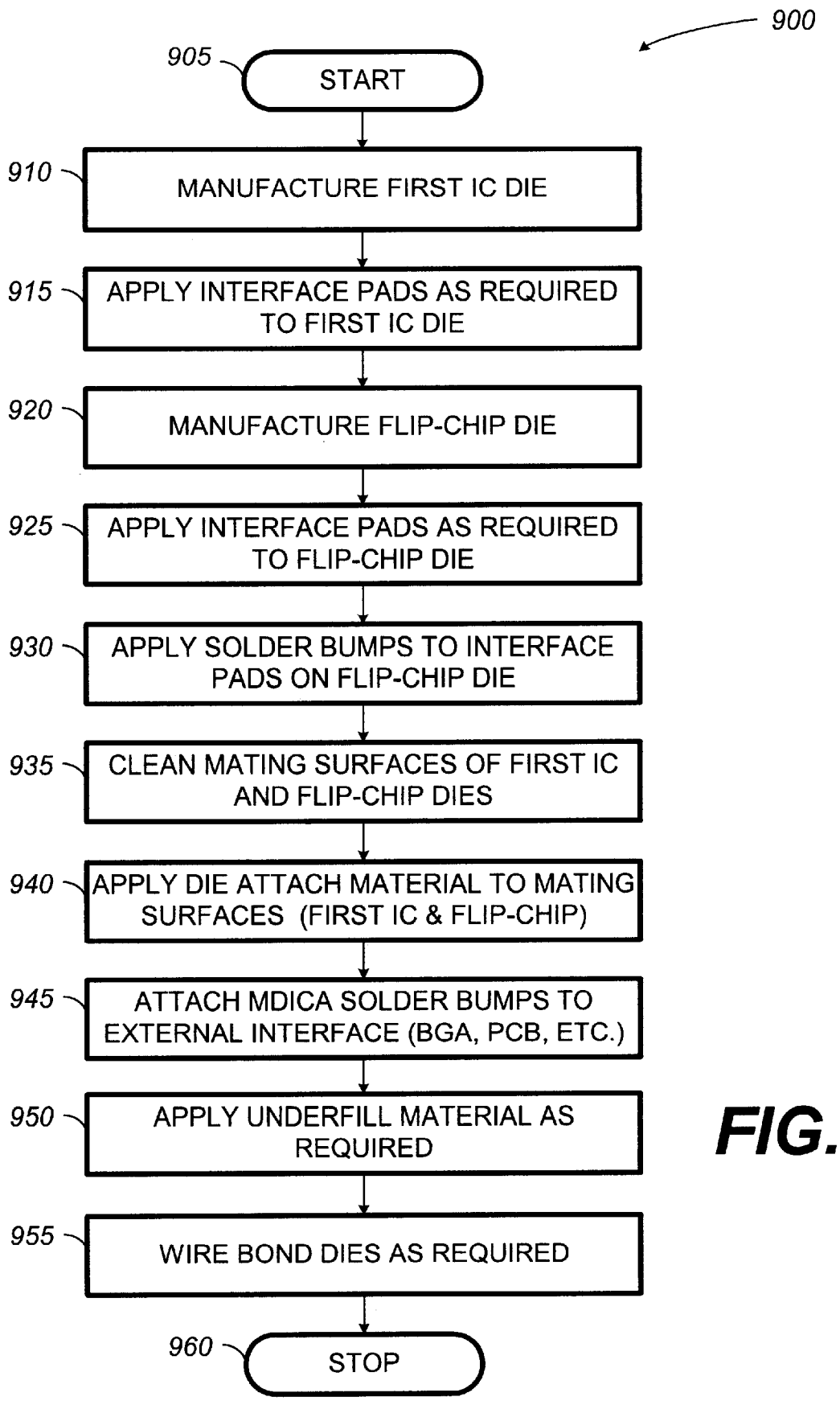
FIG. 9 is a flowchart illustrating a method for manufacturing the multi-die IC assembly of FIG. 4.

Any process descriptions or blocks in the flow chart of FIG. 9 should be understood as representing manufacturing steps for assembling the MDICA 400 introduced in FIG. 4. Alternative implementations are included within the scope of the present invention in which process steps may be executed out of order from that shown or discussed, including substantially concurrently or in reverse order, depending on the step involved, as would be understood by those reasonably skilled in the art of the present invention.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention as protected and set forth by the following claims.

Having thus described the invention, what is claimed is the following:

1. A multiple-die integrated circuit assembly, comprising:
   a substrate having a first level, a second level, and a third level, the first and second levels of the substrate defining a multiple-level cavity configured to receive the multiple-die integrated circuit assembly, the first level and second levels of the substrate each comprising a plurality of conductive pads, wherein the conductive pads on the first level of the substrate are associated with a solder bump;

a first semiconductor die having a first surface and an opposing second surface, the first surface having a plurality of conductive pads arranged to contact a plurality of the conductive pads on the first level of the substrate; and a first conductor coupled to one of the conductive pads on the first semiconductor die and to a first conductive pad on the second level of the substrate.

2. the assembly of claim 1, further comprising:

a second semiconductor die having a first surface and an opposing second surface, the first surface having a plurality of conductive pads, wherein the second surface of the second semiconductor die and the second surface of the first semiconductor die are adjacent to one another; and a second conductor coupled to one of the conductive pads on the second semiconductor die and to a second conductive pad on the second level of the substrate.

3. The assembly of claim 1, wherein the plurality of conductive pads on the second level of the substrate are arranged adjacent to the edge of the second level of the substrate.

4. The assembly of claim 2, wherein the first semiconductor die comprises a flip-chip.

5. The assembly of claim 2, wherein the second surface of the second semiconductor die is fixedly attached to the second surface of the first semiconductor die.

6. The assembly of claim 2, wherein the first semiconductor die and the second semiconductor die are fixedly attached to each other with a semiconductor die-attach material.

7. The assembly of claim 1, wherein the conductive pad on the first semiconductor die and the conductive pad on the second level of the substrate are arranged such that the distance traversed by the first conductor is minimized.

8. The assembly of claim 2, wherein the conductive pad on the second semiconductor die and the conductive pad on the second level of the substrate are arranged such that the distance traversed by the second conductor is minimized.

9. The assembly of claim 1, further comprising:

a second conductor coupled to at least one pad of the second semiconductor die and a second conductive pad on the second level of the substrate.

10. The assembly of claim 9, wherein the at least one conductive pad associated with the second semiconductor die is located substantially adjacent to the second conductive pad on the substrate.

11. The assembly of claim 2, wherein the plurality of conductive pads on the second semiconductor die are arranged along the perimeter of the second semiconductor die.

12. A multiple-die integrated circuit assembly, comprising:

means for fixedly attaching a first semiconductor die to a second semiconductor die to generate a composite semiconductor die, wherein each semiconductor die comprises a surface having at least one respective circuit and wherein the respective circuits oppose each other;

means for fixedly attaching the composite semiconductor die to a first level of a multi-level substrate; and means for electrically coupling the at least one respective circuit of each of the first and second semiconductor dies, wherein coupling occurs on a second level of the substrate.

13. The assembly of claim 12, wherein the attaching means comprises die-attach material.

14. The assembly of claim 12, wherein the coupling means comprises at least one bond pad applied to the surfaces.

15. The assembly of claim 14, wherein the means for electrically coupling comprises a wire having a proximal end and a distal end, the proximal end of the wire connected to the at least one pad on the first semiconductor die, the distal end of the wire connected to the at least one pad on the second semiconductor die.

16. The assembly of claim 14, wherein the means for electrically coupling comprises a solder bump associated with the at least one conductive pad on the second semiconductor die.

* * * * *